United States Patent
Lin et al.

(10) Patent No.: US 12,338,926 B1
(45) Date of Patent: Jun. 24, 2025

(54) FLOATING JOINT AND RETAINER CONNECTION STRUCTURE

(71) Applicant: FOSITEK CORPORATION, New Taipei (TW)

(72) Inventors: Chun-Han Lin, New Taipei (TW); Yung-Chih Tseng, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 18/583,964

(22) Filed: Feb. 22, 2024

(30) Foreign Application Priority Data

Feb. 6, 2024 (TW) .................................. 113104756

(51) Int. Cl.
| F16L 27/02 | (2006.01) |
| F16L 21/00 | (2006.01) |
| F16L 35/00 | (2006.01) |
| H05K 7/20  | (2006.01) |

(52) U.S. Cl.
CPC ............ *F16L 35/00* (2013.01); *F16L 21/002* (2013.01); *F16L 27/026* (2013.01); *H05K 7/20781* (2013.01)

(58) Field of Classification Search
CPC . F16L 37/52; F16L 37/50; F16L 27/02; F16L 27/026
USPC ..................................... 285/24, 27, 224, 920
See application file for complete search history.

(56) References Cited

U.S. PATENT DOCUMENTS

| 759,784 A * | 5/1904 | Weken ................... F16L 37/002 |
| | | 285/24 |
| 1,153,318 A * | 9/1915 | Kirkpatrick ........... F16L 37/002 |
| | | 285/24 |
| 3,774,636 A * | 11/1973 | Arita ....................... F16L 37/32 |
| | | 137/614.04 |
| 4,139,222 A * | 2/1979 | Loland ................... F16L 33/221 |
| | | 285/12 |

(Continued)

FOREIGN PATENT DOCUMENTS

| TW | M574197 U | 2/2019 |
| TW | I743776 B | 10/2021 |
| TW | M655562 U | 5/2024 |

OTHER PUBLICATIONS

Search Report dated Oct. 1, 2024 issued by Taiwan Intellectual Property Office for counterpart application No. 113104756.

*Primary Examiner* — David Bochna
(74) *Attorney, Agent, or Firm* — Demian K. Jackson; Jackson IPG PLLC

(57) ABSTRACT

A floating joint and retainer connection structure includes a hollow fixed retainer having one closed side formed with a through opening and radially extended sliding slot pairs; an adaptor joint having a pipe connecting and a joining section connected to the retainer and a male coupler, respectively; a first sliding member having an opening fitted on the pipe connecting section, a first slide movably engaged with the sliding slots, and a front guiding recess; a second sliding member having a bore fitted on the pipe connecting section and shaped for slidably engaging with the guiding recess; and a retaining ring fitted on the pipe connecting section and attached to the second sliding member to limit the first and second sliding members from moving axially. With the first and second sliding members, the adaptor joint can translate (Continued)

to correct a radial fit tolerance and be conveniently assembled to the fixed retainer.

5 Claims, 4 Drawing Sheets

(56) References Cited

U.S. PATENT DOCUMENTS

| | | | | |
|---|---|---|---|---|
| 4,426,104 | A * | 1/1984 | Hazelrigg | F16L 1/26 |
| | | | | 285/27 |
| 7,464,967 | B2 * | 12/2008 | Mieger | B60D 1/62 |
| | | | | 37/468 |
| 7,967,070 | B2 * | 6/2011 | Reddy | F16L 1/123 |
| | | | | 166/341 |
| 10,164,373 | B1 * | 12/2018 | Cheon | H05K 7/20781 |
| 11,892,252 | B2 * | 2/2024 | Yang | H05K 7/20772 |
| 11,898,674 | B2 * | 2/2024 | Yang | F16L 37/00 |
| 2017/0257980 | A1 * | 9/2017 | Fukunaga | F16L 37/40 |
| 2020/0041057 | A1 * | 2/2020 | Rapien | F16L 37/54 |
| 2021/0348706 | A1 | 11/2021 | Yang et al. | |
| 2024/0175528 | A1 * | 5/2024 | Peng | F16L 37/50 |

* cited by examiner

FLOATING JOINT AND RETAINER CONNECTION STRUCTURE

This application claims the priority benefit of Taiwan patent application number 113104756 filed on Feb. 6, 2024.

FIELD OF THE INVENTION

The present invention relates to a floating joint and retainer connection structure, and more particularly, to a floating joint and retainer connection structure that allows the floating joint assembled to the fixed retainer to translate radially, so as to compensate and correct a large radial tolerance between two non-coaxial quick couplers, allowing the latter to be successfully coupled together.

BACKGROUND OF THE INVENTION

The existing server has highly increased computing performance, but the computing unit therein also produces more heat. Since there is a plurality of servers mounted in one server cabinet and the servers are closely arranged in the server cabinet with a relatively small space left between them, it is impossible to provide an additional thermal module for each of the servers to dissipate the heat produced by them. Further, the conventional air cooling thermal module can no longer satisfactorily dissipate the large amount of heat produced by existing servers. Owing to the small space left between the servers, the produced heat tends to accumulate in the servers.

Therefore, manufacturers try to remove the heat from the servers in the server cabinet by water cooling. In consideration of the precision electronic parts in the servers, it is necessary to prevent all pipe joints in the water cooling system from leaking, so as to protect the electronic parts from damages caused by water leaking. For this purpose, most of the pipes for the water cooling system of the servers are made of hard or metal materials; and most of the circulating pipes are provided on the server cabinet. The servers are set in the server cabinet like drawers on a desk, that is, the servers are to be horizontally pulled and pushed relative to the server cabinet. Therefore, a male and a female quick coupler are correspondingly provided on between the server and the server cabinet. Usually, a small radial tolerance would exist between the water cooling pipes mounted on the server and the server cabinet, and it is necessary to correct the radial tolerance quickly. For this purpose, at least one guide stem is provided near a position on the server cabinet for mounting the quick coupler, and a guide block internally defining a guiding bore is provided on the server near a quick coupler mounting position corresponding to the guide stem. To assemble the two quick couplers to each other, first insert the guide stem into the guiding bore in the guide block for guiding the two initially eccentric quick couplers to a concentric position, so that the two quick couplers can be serially connected end to end.

The conventional or prior art water cooling couplers are fixedly provided on the server cabinet and the servers. In the case the radial tolerance between the two couplers is relatively large, it is impossible to guide them to the concentric position via the guide stem and the guide block. It is therefore desirable to find a way to compensate and correct the large radial tolerance between two quick couplers.

SUMMARY OF THE INVENTION

To effectively overcome the above problems, a primary object of the present invention is to provide a floating joint and retainer connection structure, which has a floating adaptor joint allowed for translating radially relative to a fixed retainer, so that a large radial fit tolerance between two quick couplers can be successfully compensated and corrected for the two quick couplers to couple together.

To achieve the above and other objects, the floating joint and retainer connection structure according to the present invention includes a fixed retainer, an adaptor joint, a first sliding member, a second sliding member, and a retaining ring.

The fixed retainer has an open side and an axially opposed closed side, and a receiving space defined in the fixed retainer between the open side and the closed side. The closed side is formed with a through opening and at least one sliding slot extended radially outward from the through opening; and the sliding slot is communicable with the through opening and the receiving space.

The adaptor joint has a front end and an axially opposed rear end defined as a pipe connecting section and a joining section, respectively; and a guide section extended rearward from the joining section. The adaptor joint is assembled to the fixed retainer with the pipe connecting section extending forward through the through opening to an outer side of the fixed retainer. And, the joining section and the guide section have a connecting section formed between them.

The first sliding member has a first side axially facing rearward and a second side axially facing forward, and a penetrating opening extending through the first and the second side and being fitted on an outer side of the pipe connecting section. The first sliding member is provided on the first side with a first slide, which is fitted in and movable vertically relative to the sliding slot. The second side of the first sliding member is provided with a guiding recess communicable with the penetrating opening.

The second sliding member has a fitting bore provided thereon for fitting on the outer side of the pipe connecting section. Further, the second sliding member has at least one edge being fitted in and movable horizontally relative to the guiding recess on the first sliding member.

The retaining ring is fitted on the outer side of the pipe connecting section and attached to one surface of the second sliding member to prevent the first and the second sliding member from axially moving out of the pipe connecting section.

The provision of the first and the second sliding member enables the adaptor joint assembled to the fixed retainer to translate radially relative to the fixed retainer to compensate and correct the large radial fit tolerance between the quick couplers to be coupled together, so that the quick couplers can be successfully coupled end to end.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some embodiments thereof.

Figure 1:
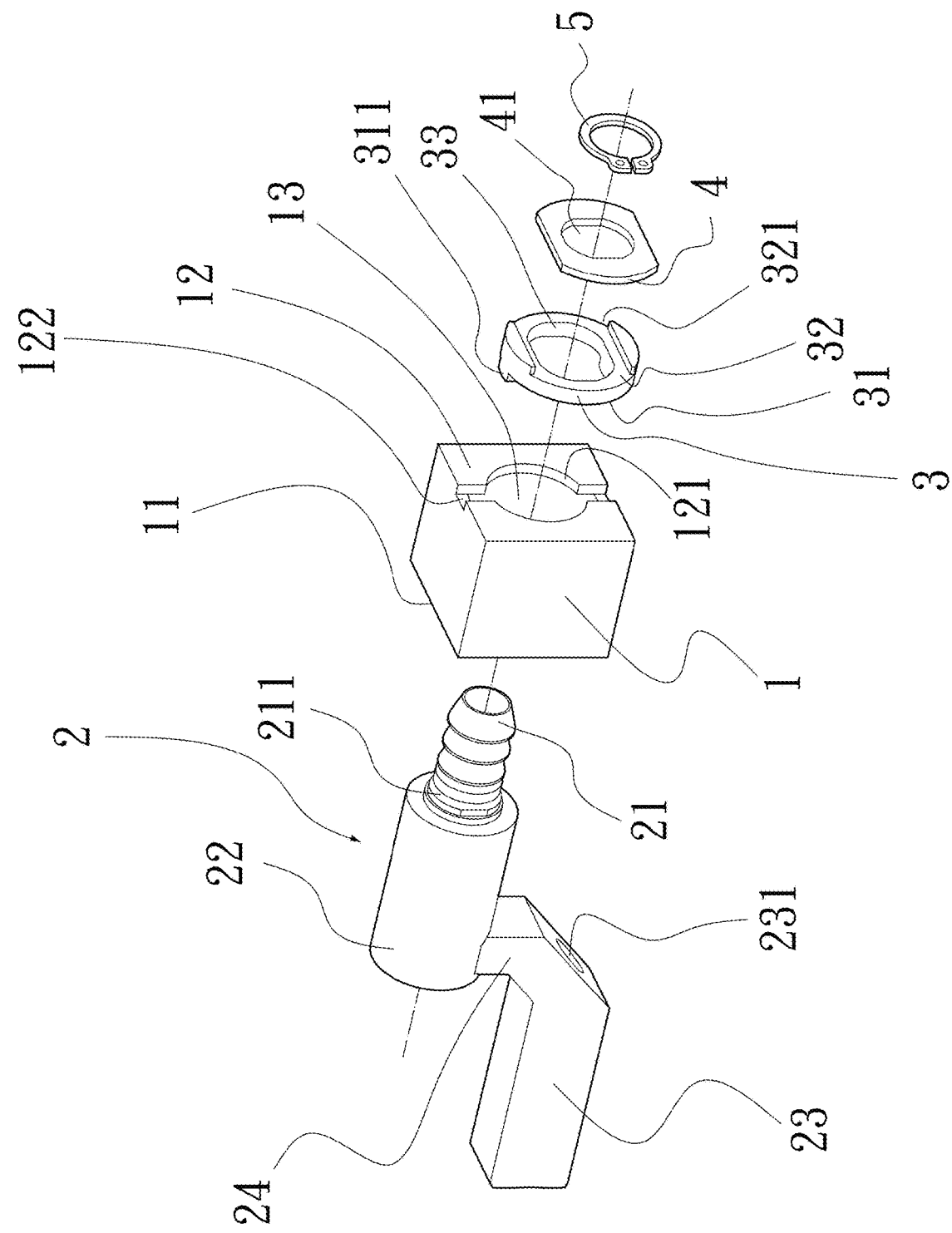
FIG. 1 is an exploded perspective view of a floating joint and retainer connection structure according to a preferred embodiment of the present invention.
Figure 2:
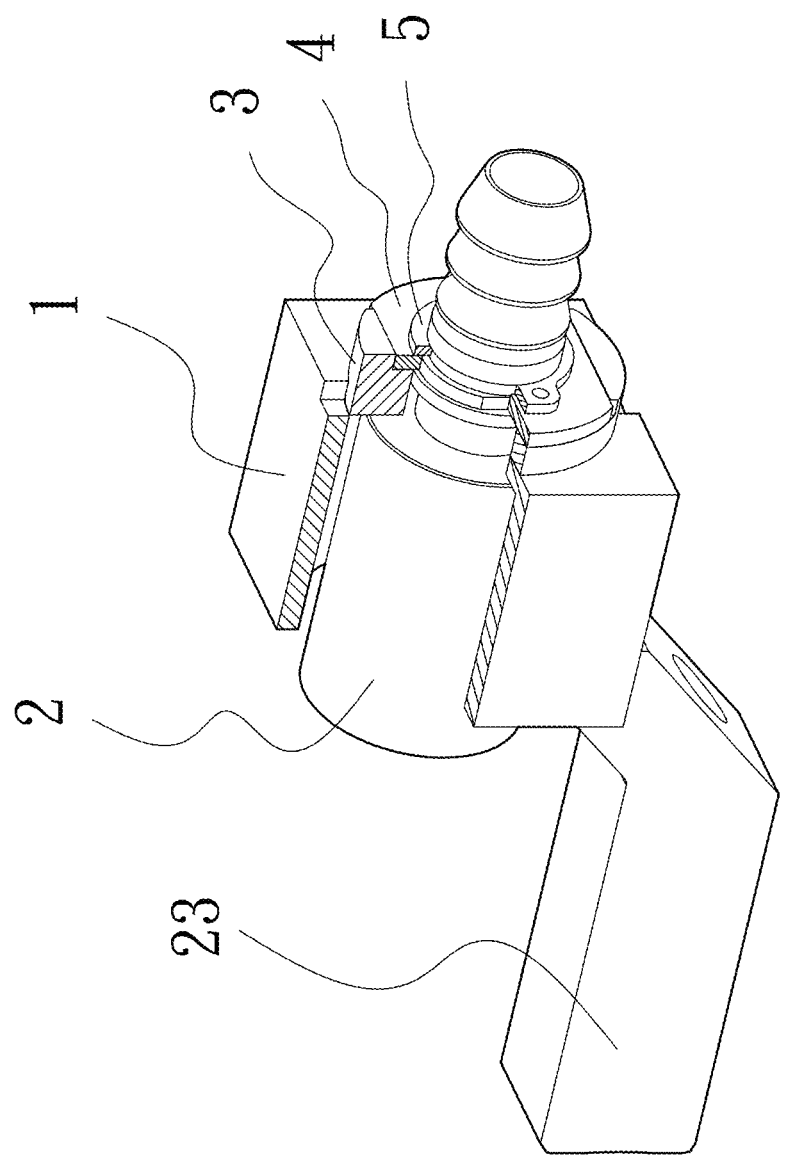
FIG. 2 is an assembled view of FIG. 1.

Please refer to FIGS. 1 and 2, which are exploded and assembled perspective views, respectively, of a floating joint and retainer connection structure according to a preferred embodiment of the present invention. As shown, the floating joint and retainer connection structure includes a fixed retainer 1, an adaptor joint 2, a first slidable element 3, a second slidable element 4, and a retaining ring 5.

The fixed retainer 1 has two axially opposed sides, namely, a rear open side 11 and a front closed side 12; and a hollow receiving space 13 defined in the fixed retainer 1 between the open side 11 and the closed side 12. The closed side 12 has a through opening 121 formed thereon, and at least one sliding slot 122 passing through a center of the through opening 121. In the illustrated preferred embodiment, there is provided one pair of two sliding slots 122, which are located diametrically opposite to each other. The sliding slots 122 are radially communicable with the through opening 121 and axially communicable with the receiving space 13.

In another embodiment, there can be a plurality of sliding slots 122 radially extending outside from the center of the through opening 121 on the closed side 11 of the fixed retainer 1. These sliding slots 122 are arranged in pairs, each of which includes two diametrically opposite sliding slots 122, such that the sliding slots 122 in the pairs can be vertically, horizontally, or diagonally corresponding to each other. Further, while all the sliding slot pairs are radially communicable with the through opening 121 and axially communicable with the receiving space 13, they do not communicable with each other, so that the first sliding member 3 is limited by the sliding slot pairs from rotating or turning.

An end of the sliding slot 122 communicating with the through opening 121 is defined as a connecting end, and another end of the sliding slot 122 located at an edge of the closed side 12 is defined as an open end. A distance between the connecting end and the open end of the sliding slot 122 is defined as the displacement allowed for radial translation of the present invention, and a total allowed radial displacement of two corresponding sliding slots 122 is the distance between the open end of one sliding slot 122 to the open end of an opposing corresponding sliding slot 122.

The adaptor joint 2 has two axially spaced sections, namely, a front pipe connecting section 21 and a rear joining section 22. A guide section 23 is extended rearward from a lower side of the joining section 22 and internally defines a guiding bore 231. The pipe connecting section 21 of the adaptor joint 2 extends from the open side 11 of the fixed retainer 1 through the receiving space 13 to an outer side of the fixed retainer 1 via the through opening 121, such that the adaptor joint 2 is assembled to the fixed retainer 1. A connecting section 24 is located between the joining section 22 and the guide section 23; and the connecting section 24 may be integrally or non-integrally formed with the pipe connecting section 21 and the guide section 23.

The first sliding member 3 has a rear and a front side, which are defined as a first side 31 and a second side 32, respectively; and a penetrating opening 33 axially extending through the first and the second side 31, 32 and being fitted around an outer side of the pipe connecting section 21. The first sliding member 3 is provided on the first side 31 with a first slide 311, which is illustrated in the preferred embodiment as an axially protruded guide block. And, in the illustrated preferred embodiment of the present invention, the sliding slots 122 are respectively a groove or a recess but not particularly limited thereto; and the first slide 311 is at least one guide block. Alternatively, the sliding slot 122 and the first slide 311 can be configured reversely. The first slide 311 and the sliding slots 122 are slidably fitted together, such that the first slide 311 can translate or slide upward and downward (i.e. vertically) in and relative to the sliding slots 122. The second side 32 is formed with a guiding recess 321, which is communicable with the penetrating opening 33.

The second sliding member 4 is formed with a fitting bore 41, which can be fitted around the outer side of the pipe connecting section 21. The second sliding member 4 has a non-circular outer contour matching that of the guiding recess 321 on the first sliding member 3. The second sliding member 4 has at least one edge corresponding to the sliding recess 321 of the first sliding member 3, allowing the second sliding member 4 to fitly set in the sliding recess 321 to move or slide leftward or rightward (i.e. horizontally) in the sliding recess 321 relative to of the first sliding member 3.

The pipe connecting section 21 includes at least one annular groove 211. The annular retaining ring 5 is fitted on the outer side of the pipe connecting section 21 and located in the annular groove 211 with one side attached to one surface of the second sliding member 4. The retaining ring 5 serves as an axial stopper and locating means to prevent the first and the second sliding member 3, 4 from moving axially to undesirably fall out of the pipe connecting section 21.

A buffering section is formed between the pipe connecting section 21 and the joining section 22. The buffering section has an outer diameter smaller than that of the joining section 22 and has at least one spring and a washer fitted around an outer side thereof. The spring has two ends, one of which is elastically pressed against the closed side of the fixed retainer 1 while the other one is elastically pressed against the washer. With the arrangements of the present invention, an axial friction is created to provide anti-thrust and buffering effect to the adaptor joint 2, preventing the adaptor joint 2 from displacing or biasing due to the force of gravity and ensuring an increased axial stability before the floating joint and retainer connection structure is assembled.

Figure 3:
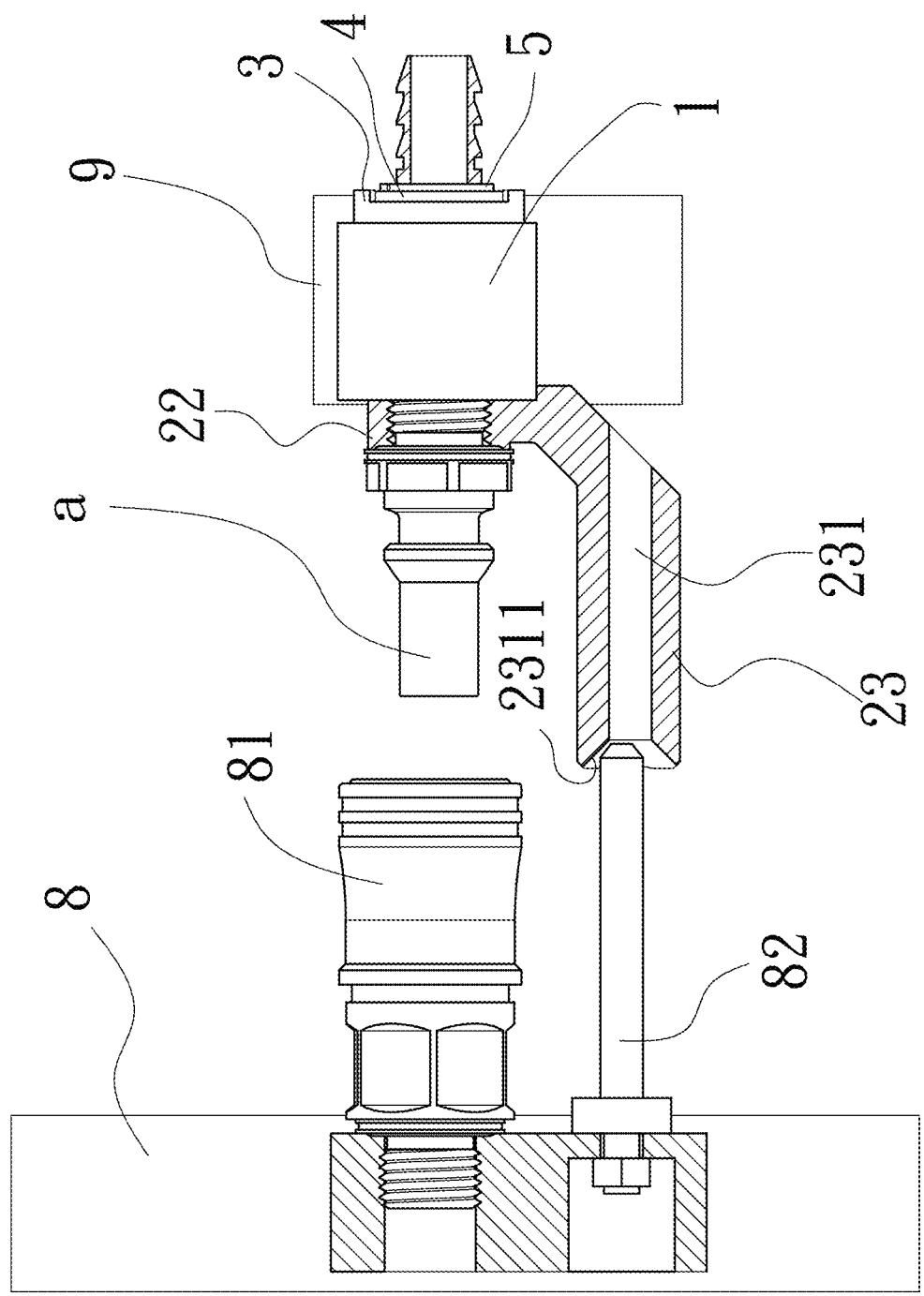
FIG. 3 is a partially sectional side view of the floating joint and retainer connection structure according to a preferred embodiment of the present invention showing the same is coupled to a fixed part.

FIG. 3 shows the floating joint and retainer connection structure of the present invention is coupled with a fixed part. Please refer to FIG. 3 along with FIGS. 1 and 2. As shown, a fixed part is located at a left side of FIG. 3. In the preferred embodiment, the fixed part is illustrated as a server cabinet 8, on which a water cooling pipe coupling structure is mounted. In the illustrated embodiment, the water cooling pipe coupling structure includes a female coupler 81 for a quick coupler assembly and a guide stem 82. Meanwhile, a movable part is located at a right side of FIG. 3 opposed to the server cabinet 8. The movable part includes a server rack 9. The floating joint and retainer connection structure of the present invention is provided on the server rack 9 and includes the above-mentioned fixed retainer 1, the adaptor joint 2, the first sliding member 3, the second sliding member 4, and the retaining ring 5. The fixed retainer 1 serves as a holding element to fixedly hold the adaptor joint 2, the first sliding member 3, the second sliding member 4, and the retaining ring 5 to the server rank 9. A male coupler "a" is connected to the joining section 22 of the adaptor joint 2. As shown in the drawings, to assembling the movable part to the fixed part, first extend the guide stem 82 into the guide section 23, so that the fixed part and the movable part are preliminarily aligned to ensure the male coupler "a" and the female coupler 81 of the quick coupler assembly are axially coupled with each other. In the case a relatively large fit tolerance exists between the male coupler "a" and the female coupler 81, first extend the guide stem 82 into the guiding bore 231 of the guide section 23. The guiding bore 231 has a front end formed into a conical surface 2311 that facilitates easy entrance of the guide stem 82 into the guiding bore 231. While the guide stem 82 is guided by the conical surface 2311 to enter the guiding bore 231, the adaptor joint 2 is also adjusted horizontally or vertically relative to the fixed retainer 1 with the help of the first and the second sliding member 3, 4. When the guide stem 82 is completely extended into the guiding bore 231, the axial fit tolerance between the male and the female coupler "a", 81 has also been adjusted and corrected. When the server rack 9 at the movable part is continuously moved horizontally toward the server cabinet 8 at the fixed part, the male and the female coupler "a", 81 can be successfully coupled together.

Figure 5:
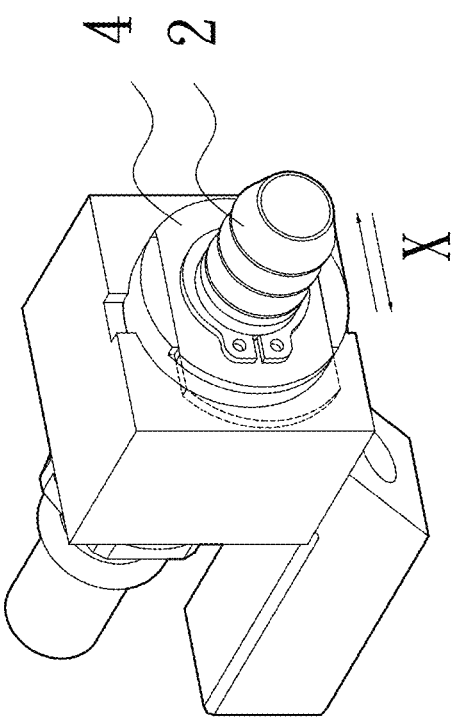
FIG. 5 is an assembled perspective view showing the present invention is adjustable horizontally in x-axis direction.
Figure 4:
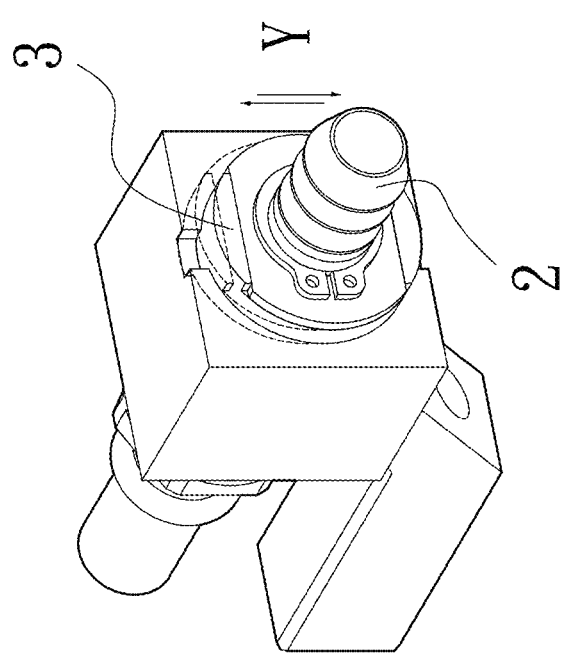
FIG. 4 is an assembled perspective view showing the present invention is adjustable vertically in y-axis direction.

Please refer to FIGS. 4 and 5, which show how the floating joint and retainer connection structure of the present invention works. As shown, while the fixed retainer 1 is a fixed member to hold the whole server rack in place and the adaptor joint 2 is the one to be displaced and adjusted radially relative to the fixed retainer 1, the first and the second sliding member 3, 4 provide two displacement and adjustment paths in y-axis and in x-axis direction, respectively. As shown in FIG. 4, the first sliding member 3 provides a y-axis displacement and adjustment path for the adaptor joint 2 to displace radially in the y-axis direction. On the other hand, as shown in FIG. 5, the second sliding member 4 provides an x-axis displacement and adjustment path for the adaptor joint 2 to displace radially in the x-axis direction. With the displacement and adjustment paths provided by the first and the second sliding member 3, 4, it is also possible to prevent the adaptor joint 2 from axial biasing.

The present invention overcomes the problem in the prior art quick coupling that two couplers having a relative large radial fit tolerance between them might not be successfully coupled with each other. In the present invention, the provision of the first and the second sliding member enables the adaptor joint assembled to the fixed retainer to translate radially relative to the fixed retainer to compensate the large radial fit tolerance between the quick couplers to be coupled together, so that the quick couplers can be successfully coupled end to end. In conclusions, the present invention has the following advantages:

1) It allows the adaptor joint to translate or displace radially to correct the radial deviation and compensate the fit tolerance existed between two couplers;
2) It avoids rubbing and wearing owing to excessive friction between the couplers;
3) It avoids the adaptor joint from rotating relative to the fixed retainer; and
4) The adaptor joint allows a pipe to extend in and through it without the need of providing additional paths or flow passages.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A floating joint and retainer connection structure, comprising:
a fixed retainer having an open side and an axially opposing closed side, and a receiving space defined in the fixed retainer between the open side and the closed side; the closed side being formed with a through opening and at least one sliding slot extended radially outward from the through opening; and the sliding slot being communicable with the through opening and the receiving space;
an adaptor joint having a front end and an axially opposed rear end defined as a pipe connecting section and a joining section, respectively, and a guide section rearward extended from the joining section; the adaptor joint being assembled to the fixed retainer with the pipe connecting section forward extending through the through opening to an outer side of the fixed retainer; and the joining section and the guide section having a connecting section formed between them;
a first sliding member having a first side axially facing rearward and a second side axially facing forward, and a penetrating opening extending through the first and the second side and being fitted on an outer side of the pipe connecting section; the first sliding member being provided on the first side with a first slide, which is fitted in and movable relative to the sliding slot; and the second side of the first sliding member being provided with a guiding recess;
a second sliding member having a fitting bore provided thereon for fitting on the outer side of the pipe connecting section; and the second sliding member having at least one edge being fitted in and movable relative to the guiding recess on the first sliding member; and
a retaining ring being fitted on the outer side of the pipe connecting section and attached to one surface of the second sliding member to prevent the first and the second sliding member from axially moving out of the pipe connecting section.

2. The floating joint and retainer connection structure as claimed in claim 1, wherein the connecting section is selectively integrally or non-integrally formed with the joining section and the guide section.

3. The floating joint and retainer connection structure as claimed in claim 1, wherein the guide section internally defines a guiding bore.

4. The floating joint and retainer connection structure as claimed in claim 1, wherein the pipe connecting section has an annular groove formed around it, and the retaining ring being fitted in the annular groove.

5. The floating joint and retainer connection structure as claimed in claim 1, wherein the sliding slot and the first slide are a mutually engaged recess and protrusion, respectively; and the sliding slot being a groove and the first slide being a guide block.

* * * * *